United States Patent
Rhodes (10) Patent No.: US 7,199,405 B2
(45) Date of Patent: Apr. 3, 2007

(54) PIXEL CELL WITH HIGH STORAGE CAPACITANCE FOR A CMOS IMAGER

(75) Inventor: Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 199 days.

(21) Appl. No.: 10/968,289

(22) Filed: Oct. 20, 2004

(65) Prior Publication Data

US 2005/0077554 A1 Apr. 14, 2005

Related U.S. Application Data (62) Division of application No. 10/411,158, filed on Apr. 11, 2003, now Pat. No. 6,853,045, which is a division of application No. 10/086,535, filed on Mar. 4, 2002, now Pat. No. 6,723,594, which is a division of application No. 09/513,470, filed on Feb. 25, 2000, now Pat. No. 6,407,440.

(51) Int. Cl.
*H01L 31/0328* (2006.01)

(52) U.S. Cl. .............. 257/184; 257/187; 257/218; 257/222; 257/257; 257/291; 257/462

(58) Field of Classification Search .............. None
See application file for complete search history.

(56) References Cited

U.S. PATENT DOCUMENTS

| | | |
|---|---|---|
| 3,983,395 A | 9/1976 | Kim |
| 4,374,700 A | 2/1983 | Scott et al. |
| 4,636,829 A | 1/1987 | Greenwood et al. |
| 4,737,852 A | 4/1988 | Dohkoshi et al. |
| 5,151,385 A | 9/1992 | Yamamoto et al. |
| 5,319,604 A | 6/1994 | Imondi et al. |
| 5,457,433 A | 10/1995 | Westwick |
| 5,461,425 A | 10/1995 | Fowler et al. |
| 5,471,515 A | 11/1995 | Fossum et al. |
| 5,541,402 A | 7/1996 | Ackland et al. |

(Continued)

FOREIGN PATENT DOCUMENTS

JP A-04357873 12/1992

(Continued)

OTHER PUBLICATIONS

Dickinson, A., et al., *A 256×256 CMOS Active Pixel Image Sensor with Motion Detection*, 1995 IEEE International Solid-State Circuits Conference, pp. 226-227.

(Continued)

*Primary Examiner*—Wai-Sing Louie
(74) *Attorney, Agent, or Firm*—Dickstein Shapiro, LLP (57) ABSTRACT

A pixel sensor cell for use in a CMOS imager exhibiting improved storage capacitance. The source follower transistor is formed with a large gate that has an area from about 0.3 $\mu m^2$ to about 10 $\mu m^2$. The large size of the source follower gate enables the photocharge collector area to be kept small, thereby permitting use of the pixel cell in dense arrays, and maintaining low leakage levels. Methods for forming the source follower transistor and pixel cell are also disclosed.

13 Claims, 8 Drawing Sheets

U.S. PATENT DOCUMENTS

| | | | |
|---|---|---|---|
| 5,546,205 | A | 8/1996 | Sukegawa et al. |
| 5,556,916 | A | 9/1996 | Matoba et al. |
| 5,569,616 | A | 10/1996 | Ohki et al. |
| 5,576,763 | A | 11/1996 | Ackland et al. |
| 5,606,295 | A | 2/1997 | Ohara et al. |
| 5,608,243 | A | 3/1997 | Chi et al. |
| 5,614,744 | A | 3/1997 | Merrill |
| 5,625,210 | A | 4/1997 | Lee et al. |
| 5,668,613 | A | 9/1997 | Kim et al. |
| 5,705,846 | A | 1/1998 | Merrill |
| 5,708,263 | A | 1/1998 | Wong |
| 5,747,840 | A | 5/1998 | Merrill |
| 5,757,045 | A | 5/1998 | Tsai et al. |
| 5,757,453 | A | 5/1998 | Shin et al. |
| 5,777,701 | A | 7/1998 | Zhang |
| 6,359,320 | B1 * | 3/2002 | Yamazaki et al. ........... 257/408 |
| 6,372,603 | B1 | 4/2002 | Yaung et al. |
| 6,512,544 | B1 * | 1/2003 | Merrill et al. .............. 348/302 |
| 6,630,701 | B1 * | 10/2003 | Rhodes ........................ 257/292 |

FOREIGN PATENT DOCUMENTS

| | | |
|---|---|---|
| JP | A-05063177 | 3/1993 |

OTHER PUBLICATIONS

Dickinson, A., et al., *Standard CMOS Active Pixel Image Sensors for Multimedia Applications*, Proceedings of Sixteenth Conference on Advanced Research in VLSI, Mar. 27-29, 1995, pp. 214-224.

Eid, E.S., et al., *A 256×256 CMOS Active Pixel Image Sensor*, Proc. SPIE vol. 2415, Apr. 1995, pp. 265-275.

Fossum, E., *CMOS Image Sensors; Electronic Camera On a Chip*, 1995 IEEE, pp. 17-25.

Fossum, E., *Low Power Camera-on-a-Chip Using CMOS Active Pixel Sensor Technology*, 1995 IEEE, pp. 74-77.

Fossum, E., *Architectures for focal plane image processing*, Optical Engineering, vol. 28, No. 8, Aug. 1989, pp. 865-871.

Janesick, J., et al., *New advancements in charge-coupled device technology—sub-electron noise and 4096×4096 pixel CCDs*, Proc. SPIE vol. 1242, 1990, pp. 223-237.

Kemeny, S.E., et al., *Update on focal-plane image processing research*, Proc. SPIE vol. 1447, 1991, pp. 243-250.

*Mendis, S., et al., *CMOS Active Pixel Image Sensor*, IEEE Transactions on Electron Devices, vol. 41, No. 3, Mar. 1994, pp. 452-453.

Mendis, S.K., et al., *A 128×128 CMOS Active Pixel Image Sensor for Highly Integrated Imaging Systems*, 1993 IEEE, pp. 583-586.

Mendis, S.K., et al., *CMOS Active Pixel Sensors for Highly Integrated Imaging Systems*, IEEE Journal of Solid-State Circuits, vol. 32, No. 2, Feb. 1997, pp. 187-197.

Mendis, S.K., et al., *Low-Light-Level Image Sensor with On-Chip Signal Processing*, Proc. SPIE vol. 1952, Nov. 1993, pp. 23-33.

*Mendis, S.K., et al., *Progress in CMOS Active Pixel Image Sensors*, Proc. SPIE vol. 2172, May 1994, pp. 19-29.

Nakamura, J., et al., *CMOS Active Pixel Image Sensor with Simple Floating Gate Pixels*, IEEE Transactions on Election Devices, vol. 42, No. 9, Sep. 1995, pp. 1693-1694.

Nixon, R.H., et al., *256×256 CMOS Active Pixel Sensor Camera-on-a-Chip*, IEEE Journal of Solid-State Circuits, vol. 31, No. 12, Dec. 1996, pp. 2046-2050.

Nixon, R.H., et al., *256×256 CMOS Active Pixel Sensor Camera-on-a-Chip*, 1996 IEEE International Solid-State Circuits Conference, pp. 178-179.

Panicacci, R., et al., *Programmable multiresolution CMOS active pixel sensor*, Proc. SPIE vol. 2654, Mar. 1996, pp. 72-79.

Panicacci, R.A., et al. *128Mb/s Multiport CMOS Binary Active-Pixel Image Sensor*, 1996 IEEE International Solid-State Circuits, vol. 32, No. 2, Feb. 1997, pp. 285-288.

Yadid-Pecht, O., et al., *CMOS Active Pixel Sensor Star Tracker with Regional Electronic Shutter*, IEEE Journal of Solid-State Circuits, vol. 32, No. 2, Feb. 1997, pp. 285-288.

Yadid-Pecht, O., et al., *Wide dynamic range APD star tracker*, Proc. SPIE vol. 2654, Mar. 1996, pp. 82-92.

Zarnowski, J., et al., *Imaging options expand with CMOS technology*, Laser Focus World, Jun. 1997, pp. 125-130.

Zhou, Z., et al., *A CMOS Imager with On-Chip Variable Resolution for Light-Adaptive Imaging*, 1998 IEEE International Solid-State Circuits Conference, pp. 174-175.

Zhou, Z., et al., *A Digital CMOS Active Pixel Image Sensor For Multimedia Applications*, Proc. SPIE vol. 2894, Sep. 1996, pp. 282-288.

Fossum, E., et al., *IEDM A 37×28 $mm^2$ 600 k-Pixel CMOS APS Dental X-Ray Camera-on-a-Chip with Self-Triggered Readout*, 1998 IEEE International Solid-State Circuits Conference, pp. 172-173.

Mendis, S., et al., *Design of a Low-Light Image Sensor with On-Chip Sigma-Delta Analog-to-Digital Conversion*, SPIE vol. 1900, pp. 31-39.

* cited by examiner

PIXEL CELL WITH HIGH STORAGE CAPACITANCE FOR A CMOS IMAGER

CROSS REFERENCE TO RELATED APPLICATIONS

The present application is a divisional application of Ser. No. 10/411,158, filed Apr. 11, 2003, now U.S. Pat. No. 6,853,045, which is a divisional of Ser. No. 10/086,535, filed Mar. 4, 2002, now U.S. Pat. No. 6,723,594, issued Apr. 20, 2004, which in turn is a divisional application of Ser. No. 09/513,470, filed Feb. 25, 2000, now U.S. Pat. No. 6,407,440, issued Jun. 18, 2002, the disclosures of which are herewith incorporated by reference in their entireties.

FIELD OF THE INVENTION

The present invention relates generally to CMOS imagers and in particular to a CMOS imager having a high storage capacitance due to the increased surface area of the source follower gates of each pixel.

BACKGROUND OF THE INVENTION

There are a number of different types of semiconductor-based imagers, including charge coupled devices (CCDs), photodiode arrays, charge injection devices and hybrid focal plane arrays. CCDs are often employed for image acquisition and enjoy a number of advantages which makes it the incumbent technology, particularly for small size imaging applications. CCDs are also capable of large formats with small pixel size and they employ low noise charge domain processing techniques. However, CCD imagers also suffer from a number of disadvantages. For example, they are susceptible to radiation damage, they exhibit destructive read out over time, they require good light shielding to avoid image smear and they have a high power dissipation for large arrays. Additionally, while offering high performance, CCD arrays are difficult to integrate with CMOS processing in part due to a different processing technology and to their high capacitances, complicating the integration of on-chip drive and signal processing electronics with the CCD array. While there have been some attempts to integrate on-chip signal processing with the CCD array, these attempts have not been entirely successful. CCDs also must transfer an image by line charge transfers from pixel to pixel, requiring that the entire array be read out into a memory before individual pixels or groups of pixels can be accessed and processed. This takes time. CCDs may also suffer from incomplete charge transfer from pixel to pixel during charge transfer which also results in image smear.

Because of the inherent limitations in CCD technology, there is an interest in CMOS imagers for possible use as low cost imaging devices. A fully compatible CMOS sensor technology enabling a higher level of integration of an image array with associated processing circuits would be beneficial to many digital applications such as, for example, in cameras, scanners, machine vision systems, vehicle navigation systems, video telephones, computer input devices, surveillance systems, auto focus systems, star trackers, motion detection systems, image stabilization systems and data compression systems for high-definition television.

The advantages of CMOS imagers over CCD imagers are that CMOS imagers have a low voltage operation and low power consumption; CMOS imagers are compatible with integrated on-chip electronics (control logic and timing, image processing, and signal conditioning such as A/D conversion); CMOS imagers allow random access to the image data; and CMOS imagers have lower fabrication costs as compared with the conventional CCD since standard CMOS processing techniques can be used. Additionally, low power consumption is achieved for CMOS imagers because only one row of pixels at a time needs to be active during the readout and there is no charge transfer (and associated switching) from pixel to pixel during image acquisition. On-chip integration of electronics is particularly advantageous because of the potential to perform many signal conditioning functions in the digital domain (versus analog signal processing) as well as to achieve a reduction in system size and cost.

A CMOS imager circuit includes a focal plane array of pixel cells, each one of the cells including either a photogate, photoconductor or a photodiode overlying a substrate for accumulating photo-generated charge in the underlying portion of the substrate. A readout circuit is connected to each pixel cell and includes at least an output field effect transistor formed in the substrate and a charge transfer section formed on the substrate adjacent the photogate, photoconductor or photodiode having a sensing node, typically a floating diffusion node, connected to the gate of an output transistor. The imager may include at least one electronic device such as a transistor for transferring charge from the underlying portion of the substrate to the floating diffusion node and one device, also typically a transistor, for resetting the node to a predetermined charge level prior to charge transference.

In a CMOS imager, the active elements of a pixel cell perform the necessary functions of: (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal representing pixel charge. Photo charge may be amplified when it moves from the initial charge accumulation region to the floating diffusion node. The charge at the floating diffusion node is typically converted to a pixel output voltage by a source follower output transistor. The photosensitive element of a CMOS imager pixel is typically either a depleted p-n junction photodiode or a field induced depletion region beneath a photogate. For photodiodes, image lag can be eliminated by completely depleting the photodiode upon readout.

CMOS imagers of the type discussed above are generally known as discussed, for example, in Nixon et al., "256×256 CMOS Active Pixel Sensor Camera-on-a-Chip," IEEE Journal of Solid-State Circuits, Vol. 31(12) pp. 2046–2050, 1996; Mendis et al, "CMOS Active Pixel Image Sensors," IEEE Transactions on Electron Devices, Vol. 41(3) pp. 452–453, 1994 as well as U.S. Pat. No. 5,708,263 and U.S. Pat. No. 5,471,515, which are herein incorporated by reference.

To provide context for the invention, an exemplary CMOS imaging circuit is described below with reference to FIG. 1. The circuit described below, for example, includes a photogate for accumulating photo-generated charge in an underlying portion of the substrate. It should be understood that the CMOS imager may include a photodiode or other image to charge converting device, in lieu of a photogate, as the initial accumulator for photo-generated charge.

Figure 1:
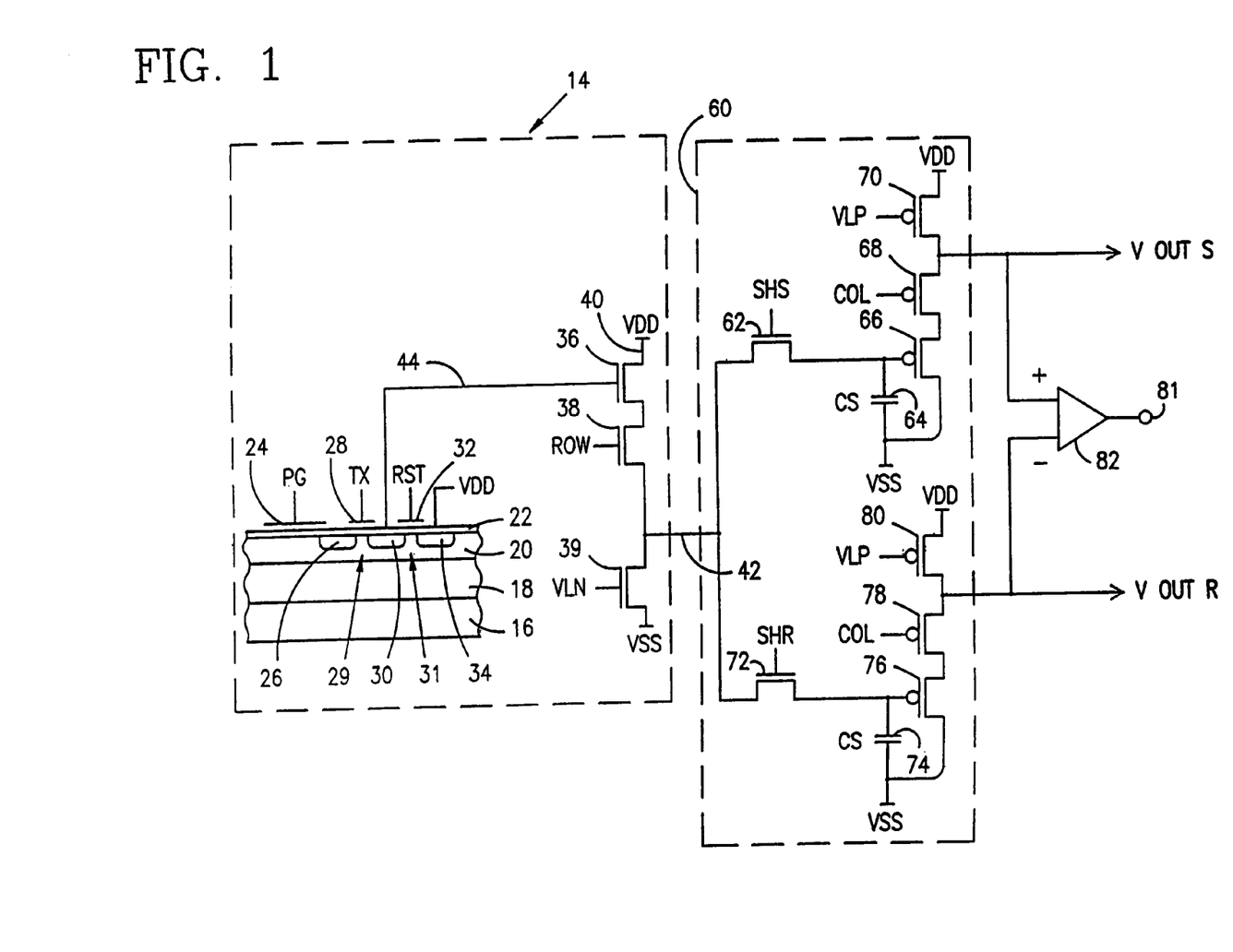
FIG. 1 is a representative circuit of a CMOS imager.

Reference is now made to FIG. 1 which shows a simplified circuit for a pixel of an exemplary CMOS imager using a photogate and having a pixel photodetector circuit 14 and a readout circuit 60. It should be understood that while FIG. 1 shows the circuitry for operation of a single pixel, that in practical use there will be an M×N array of pixels arranged in rows and columns with the pixels of the array accessed using row and column select circuitry, as described in more detail below.

The photodetector circuit 14 is shown in part as a cross-sectional view of a semiconductor substrate 16 typically a p-type silicon, having a surface well of p-type material 20. An optional layer 18 of p-type material may be used if desired, but is not required. Substrate 16 may be formed of, for example, Si, SiGe, Ge, and GaAs. Typically the entire substrate 16 is p-type doped silicon substrate and may contain a surface p-well 20 (with layer 18 omitted), but many other options are possible, such as, for example p on p– substrates, p on p+ substrates, p-wells in n-type substrates or the like. The terms wafer or substrate used in the description includes any semiconductor-based structure having an exposed surface in which to form the circuit structure used in the invention. Wafer and substrate are to be understood as including silicon-on-insulator (SOI) technology, silicon-on-sapphire (SOS) technology, doped and undoped semiconductors, epitaxial layers of silicon supported by a base semiconductor foundation, and other semiconductor structures. Furthermore, when reference is made to a wafer or substrate in the following description, previous process steps may have been utilized to form regions/junctions in the base semiconductor structure or foundation.

An insulating layer 22 such as, for example, silicon dioxide is formed on the upper surface of p-well 20. The p-type layer may be a p-well formed in substrate 16. A photogate 24 thin enough to pass radiant energy or of a material which passes radiant energy is formed on the insulating layer 22. The photogate 24 receives an applied control signal PG which causes the initial accumulation of pixel charges in n+ region 26. The n+ type region 26, adjacent one side of photogate 24, is formed in the upper surface of p-well 20. A transfer gate 28 is formed on insulating layer 22 between n+ type region 26 and a second n+ type region 30 formed in p-well 20. The n+ regions 26 and 30 and transfer gate 28 form a charge transfer transistor 29 which is controlled by a transfer signal TX. The n+ region 30 is typically called a floating diffusion region. It is also a node for passing charge accumulated thereat to the gate of a source follower transistor 36 described below. A reset gate 32 is also formed on insulating layer 22 adjacent and between n+ type region 30 and another n+ region 34 which is also formed in p-well 20. The reset gate 32 and n+ regions 30 and 34 form a reset transistor 31 which is controlled by a reset signal RST. The n+ type region 34 is coupled to voltage source VDD, e.g., 5 volts. The transfer and reset transistors 29, 31 are n-channel transistors as described in this implementation of a CMOS imager circuit in a p-well. It should be understood that it is possible to implement a CMOS imager in an n-well in which case each of the transistors would be p-channel transistors. It should also be noted that while FIG. 1 shows the use of a transfer gate 28 and associated transistor 29, this structure provides advantages, but is not required.

Photodetector circuit 14 also includes two additional n-channel transistors, source follower transistor 36 and row select transistor 38. Transistors 36, 38 are coupled in series, source to drain, with the source of transistor 36 also coupled over lead 40 to voltage source VDD and the drain of transistor 38 coupled to a lead 42. The drain of row select transistor 38 is connected via conductor 42 to the drains of similar row select transistors for other pixels in a given pixel row. A load transistor 39 is also coupled between the drain of transistor 38 and a voltage source VSS, e.g. 0 volts. Transistor 39 is kept on by a signal VLN applied to its gate.

The imager includes a readout circuit 60 which includes a signal sample and hold (S/H) circuit including a S/H n-channel field effect transistor 62 and a signal storage capacitor 64 connected to the source follower transistor 36 through row transistor 38. The other side of the capacitor 64 is connected to a source voltage VSS. The upper side of the capacitor 64 is also connected to the gate of a p-channel output transistor 66. The drain of the output transistor 66 is connected through a column select transistor 68 to a signal sample output node VOUTS and through a load transistor 70 to the voltage supply VDD. A signal called "signal sample and hold" (SHS) briefly turns on the S/H transistor 62 after the charge accumulated beneath the photogate electrode 24 has been transferred to the floating diffusion node 30 and from there to the source follower transistor 36 and through row select transistor 38 to line 42, so that the capacitor 64 stores a voltage representing the amount of charge previously accumulated beneath the photogate electrode 24.

The readout circuit 60 also includes a reset sample and hold (S/H) circuit including a S/H transistor 72 and a signal storage capacitor 74 connected through the S/H transistor 72 and through the row select transistor 38 to the source of the source follower transistor 36. The other side of the capacitor 74 is connected to the source voltage VSS. The upper side of the capacitor 74 is also connected to the gate of a p-channel output transistor 76. The drain of the output transistor 76 is connected through a p-channel column select transistor 78 to a reset sample output node VOUTR and through a load transistor 80 to the supply voltage VDD. A signal called "reset sample and hold" (SHR) briefly turns on the S/H transistor 72 immediately after the reset signal RST has caused reset transistor 31 to turn on and reset the potential of the floating diffusion node 30, so that the capacitor 74 stores the voltage to which the floating diffusion node 30 has been reset.

The readout circuit 60 provides correlated sampling of the potential of the floating diffusion node 30, first of the reset charge applied to node 30 by reset transistor 31 and then of the stored charge from the photogate 24. The two samplings of the diffusion node 30 charges produce respective output voltages VOUTR and VOUTS of the readout circuit 60. These voltages are then subtracted (VOUTS−VOUTR) by subtractor 82 to provide an output signal terminal 81 which is an image signal independent of pixel to pixel variations caused by fabrication variations in the reset voltage transistor 31 which might cause pixel to pixel variations in the output signal.

Figure 2:
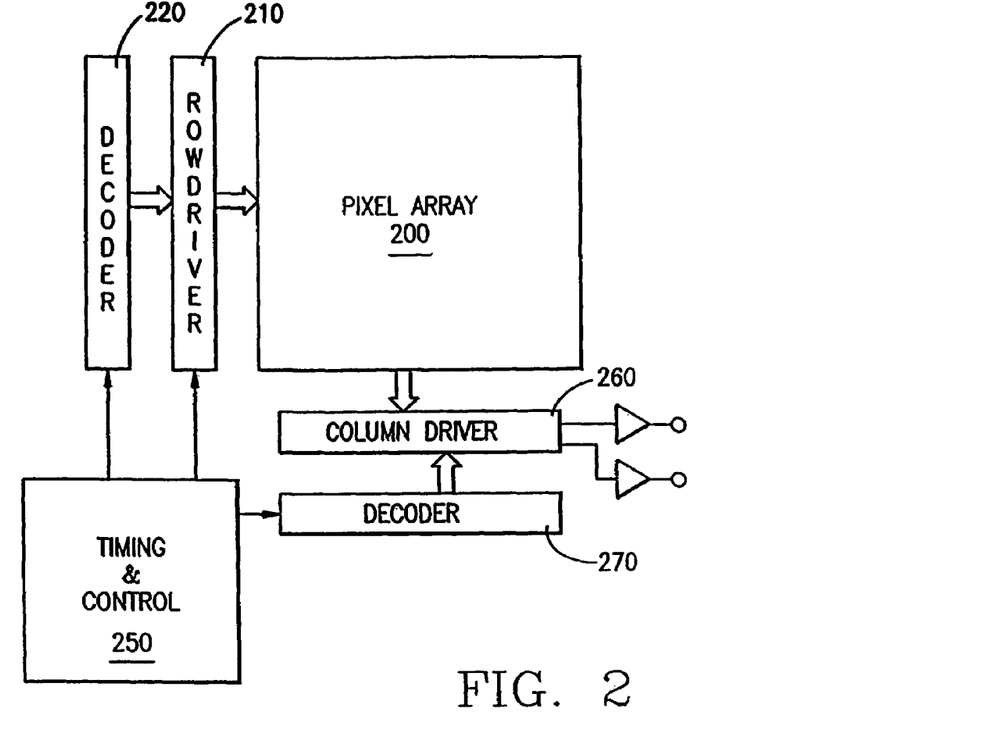
FIG. 2 is a block diagram of a CMOS pixel sensor chip.

FIG. 2 illustrates a block diagram for a CMOS imager having a pixel array 200 with each pixel cell being constructed in the manner shown by element 14 of FIG. 1. Pixel array 200 comprises a plurality of pixels arranged in a predetermined number of columns and rows. The pixels of each row in array 200 are all turned on at the same time by a row select line, e.g., line 86, and the pixels of each column are selectively output by a column select line, e.g., line 42. A plurality of rows and column lines are provided for the entire array 200. The row lines are selectively activated by the row driver 210 in response to row address decoder 220 and the column select lines are selectively activated by the column driver 260 in response to column address decoder 270. Thus, a row and column address is provided for each pixel. The CMOS imager is operated by the control circuit 250 which controls address decoders 220, 270 for selecting the appropriate row and column lines for pixel readout, and row and column driver circuitry 210, 260 which apply driving voltage to the drive transistors of the selected row and column lines.

Figure 3:
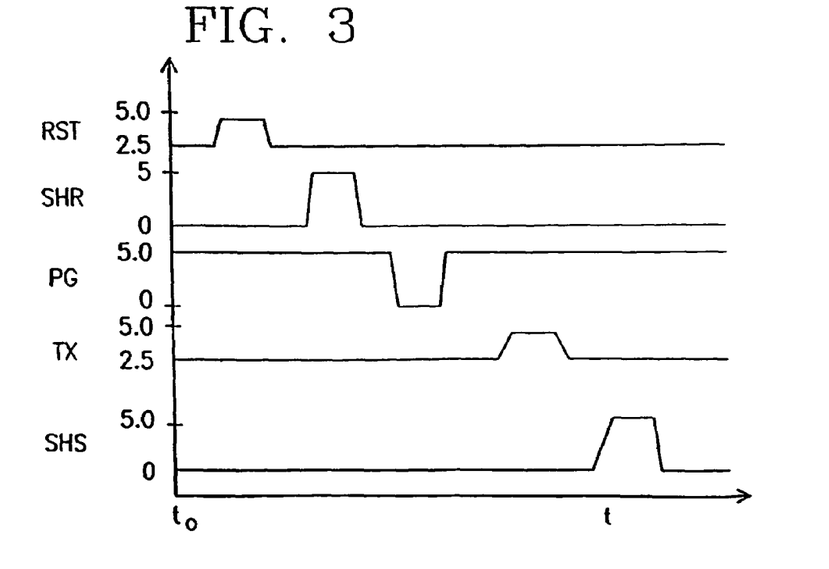
FIG. 3 is a representative timing diagram for the CMOS imager.
Figure 4:
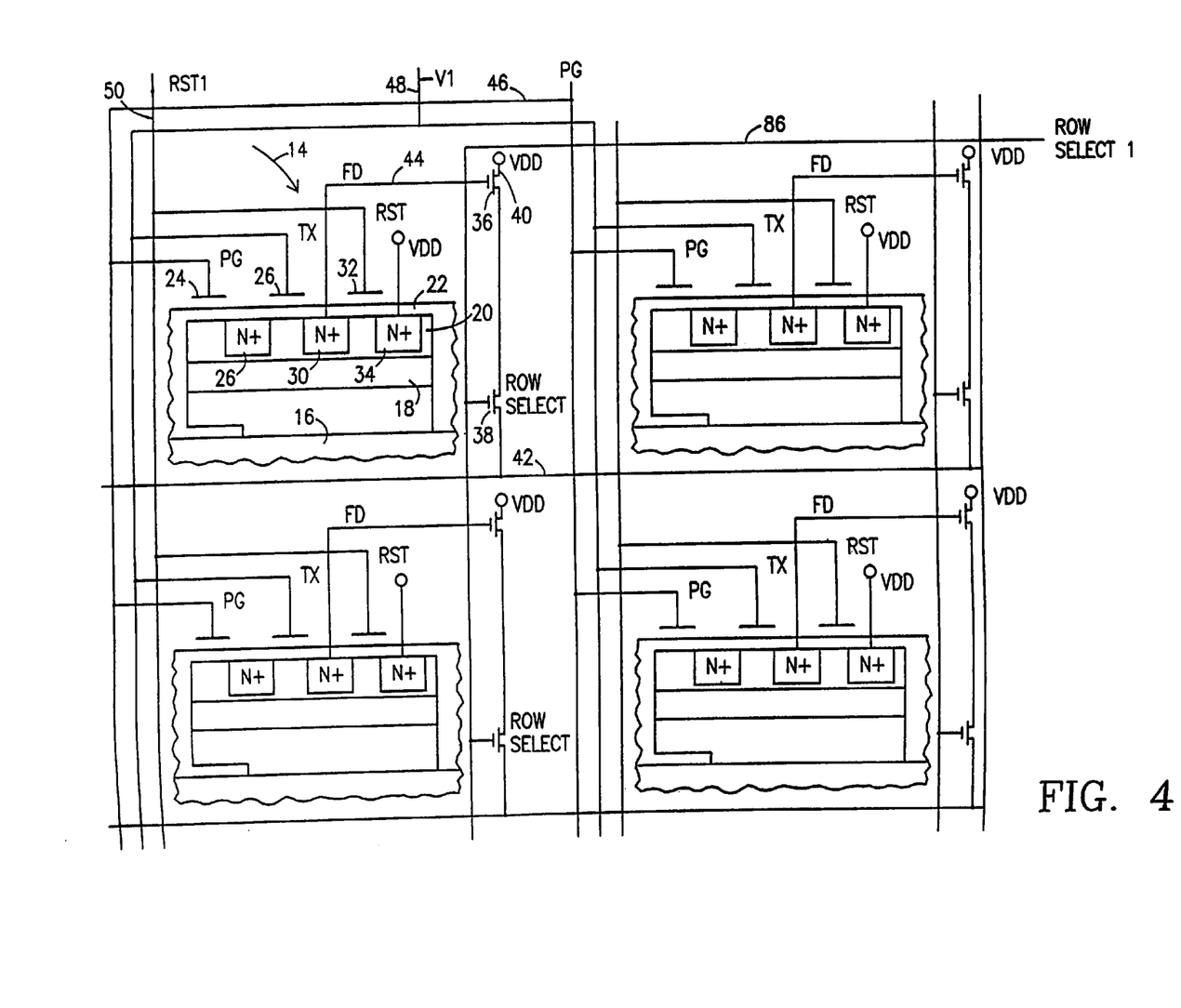
FIG. 4 is a representative pixel layout showing a 2×2 pixel layout.

FIG. 3 shows a simplified timing diagram for the signals used to transfer charge out of photodetector circuit 14 of the FIG. 1 CMOS imager. The photogate signal PG is nominally set to 5V and pulsed from 5V to 0V during integration. The reset signal RST is nominally set at 2.5V. As can be seen from the figure, the process is begun at time $t_0$ by briefly pulsing reset voltage RST to 5V. The RST voltage, which is applied to the gate 32 of reset transistor 31, causes transistor 31 to turn on and the floating diffusion node 30 to charge to the VDD voltage present at n+ region 34 (less the voltage drop Vth of transistor 31). This resets the floating diffusion node 30 to a predetermined voltage (VDD−Vth). The charge on floating diffusion node 30 is applied to the gate of the source follower transistor 36 to control the current passing through transistor 38, which has been turned on by a row select (ROW) signal, and load transistor 39. This current is translated into a voltage on line 42 which is next sampled by providing a SHR signal to the S/H transistor 72 which charges capacitor 74 with the source follower transistor output voltage on line 42 representing the reset charge present at floating diffusion node 30. The PG signal is next pulsed to 0 volts, causing charge to be collected in n+ region 26. A transfer gate voltage TX, similar to the reset pulse RST, is then applied to transfer gate 28 of transistor 29 to cause the charge in n+ region 26 to transfer to floating diffusion node 30. It should be understood that for the case of a photogate, the transfer gate voltage TX may be pulsed or held to a fixed DC potential. For the implementation of a photodiode with a transfer gate, the transfer gate voltage TX must be pulsed. The new output voltage on line 42 generated by source follower transistor 36 current is then sampled onto capacitor 64 by enabling the sample and hold switch 62 by signal SHS. The column select signal is next applied to transistors 68 and 70 and the respective charges stored in capacitors 64 and 74 are subtracted in subtractor 82 to provide a pixel output signal at terminal 81. It should also be noted that CMOS imagers may dispense with the transfer gate 28 and associated transistor 29, or retain these structures while biasing the transfer transistor 29 to an always "on" state.

The operation of the charge collection of the CMOS imager is known in the art and is described in several publications such as Mendis et al., "Progress in CMOS Active Pixel Image Sensors," SPIE Vol. 2172, pp. 19–29 1994; Mendis et al., "CMOS Active Pixel Image Sensors for Highly Integrated Imaging Systems," IEEE Journal of Solid State Circuits, Vol. 32(2), 1997; and Eric R, Fossum, "CMOS Image Sensors: Electronic Camera on a Chip," IEDM Vol. 95 pages 17–25 (1995) as well as other publications. These references are incorporated herein by reference.

Prior CMOS imagers suffer from poor signal-to-noise ratios and poor dynamic range as a result of the inability to fully collect and store the electric charge collected by the photosensitive area. Since the size of the pixel electrical signal is very small due to the collection of photons in the photoarray, the signal-to-noise ratio and dynamic range of the pixel should be as high as possible. Improved storage capacitance is therefore desirable as a means of enhancing signal-to-noise ratios and improving dynamic range. Typically storage capacitance of the pixel cell is increased by increasing the size of the photosensor, but this leads to problems of increased leakage and decreased quantum efficiency.

There is needed, therefore, a pixel cell having a high storage capacitance without increasing the photosensor size, for use in an imager. A simple method of fabricating a pixel cell with improved storage capacitance is also needed.

SUMMARY OF THE INVENTION

The present invention provides a source follower gate with improved storage capacitance formed in a semiconductor substrate. The source follower gate has a large gate area to increase the storage capacitance of the pixel cell while not requiring an increase in the photosensor size, thereby avoiding leakage problems and improving quantum efficiency. A method for forming the large source follower gate of the present invention is also provided.

Additional advantages and features of the present invention will be apparent from the following detailed description and drawings which illustrate preferred embodiments of the invention.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The term "pixel" refers to a picture element unit cell containing a photosensor and transistors for converting electromagnetic radiation to an electrical signal. For purposes of illustration, a representative pixel is illustrated in the figures and description herein, and typically fabrication of all pixels in an imager will proceed simultaneously in a similar fashion. The following detailed description is, therefore, not to be taken in a limiting sense, and the scope of the present invention is defined by the appended claims.

Figure 5:
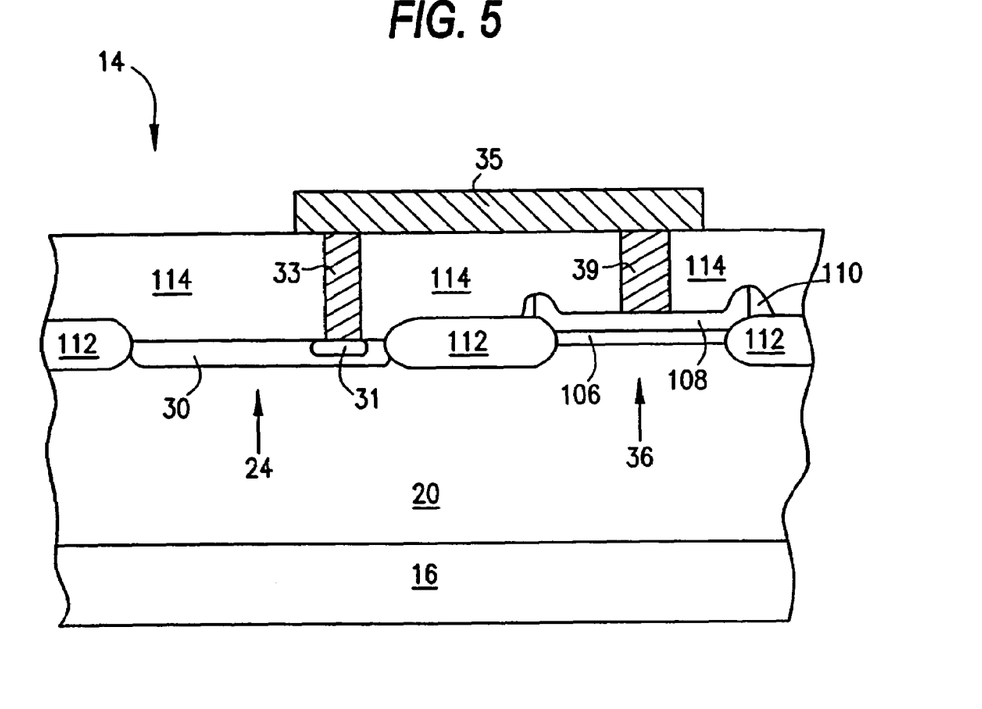
FIG. 5 is a cross-sectional diagram showing a pixel cell according to one embodiment of the present invention.

The structure of the pixel cell 14 of the first embodiment is shown in more detail in FIG. 5. FIG. 5 shows a partially cut-away cross-sectional view of a CMOS semiconductor wafer at a view orthogonal to that shown in FIG. 1. FIG. 5 shows the region from the photodiode to the source follower transistor for an imager. The pixel 14 may be formed in a substrate 16 having a doped layer or well 20 of a first conductivity type, which for exemplary purposes is treated as p-type. The photocharge collector 24 is a photosensitive region which may be, for example, a photodiode, photoconductor, or other photosensitive element capable of converting photocharge to electrical charge, but for exemplary purposes is shown and described as a photodiode. The photodiode 24 may be a p-n junction photodiode, a PIN photodiode, a Schottky photodiode, or any other suitable photodiode, and for exemplary purposes is treated as a p-n The photodiode 24 is a p-n junction diode formed by means of the p-n junction between implanted region 30 and p-well 20. Photodiode 24 may be either a simple p-n diode or a pinned diode as known in the art.

The source follower transistor 36 is spaced from the photodiode 24, and includes a silicon dioxide or silicon nitride insulator 106 on the doped layer 20, a conductive layer 108 over the insulating layer 106. The conductive layer 108 may be formed of doped silicon such as polysilicon, of metals such as tungsten, or of a composite stack of polysilicon/silicide or polysilicon/barrier/metal. The barrier metal may be, for example, those such as titanium nitride, tungsten nitride or the like. The source and drain regions for the source follower transistor 36 are not shown in FIG. 5, as they are in a plane perpendicular to the view depicted; however, an n+ implanted region 31 in the photodiode region is shown. This n+ region 31 serves to enable electrical contact between the photodiode diffusion region 30 and the source follower conductive layer 108 via conductors 33, 35 and 39. Insulating sidewalls 110 of silicon dioxide or silicon nitride may be formed on the sides of the gate stack 36.

The gate stack 36 has a generally rectangular shape when seen from above. The area of the gate stack 36 is generally of from about 0.3 $\mu m^2$ to about 25 $\mu m^2$, preferably from about 1.0 $\mu m^2$ to about 15 $\mu m^2$.

The large area of the source follower gate stack 36 permits an increase in storage capacitance for the pixel cell 14, because storage capacitance is proportional to the surface area of the conductive layer 108. Storage capacitance may be increased by increasing either the area of the photocharge collector 24 or the size of the conductive layer 108. The present invention increases the size of the source follower active area to satisfy the charge collection requirements of the imager and not place all this charge collection burden on the photodetector designs, thereby minimizing photodetector leakage.

Still with reference to FIG. 5, the doped layer 20 is provided with a doped region 30 formed therein, which is doped to a second conductivity type, which for exemplary purposes is treated as n-type. As shown in FIG. 5, the photodiode doped region 30 is also the floating diffusion region, also referred to as a floating diffusion node. However, it is to be understood that with other photosensitive elements, such as a photoconductor, additional doped regions maybe formed in the substrate. Field oxide layers 112 are formed around and within the cell 14, and they provide electrical isolation not only from pixel cell to cell, but also between devices in the cell.

A layer 114 of borophosphorosilicate glass (BPSG), phosphosilicate glass (PSG), borosilicate glass (BSG), undoped $SiO_2$ or the like is then deposited and planarized by CMP or other methods. A resist and mask (not shown) are then applied and the layer 114 is etched to form interconnects 33 and 39 over the n+diffusion region 31 and the source follower transistor gate 108 respectively. The layer 114 may be etched by any conventional methods such as a selective wet etch or a selective dry etch. Interconnects 33 and 39 are the same or different and may be formed of any typical interconnect conductive material such as metals or doped polysilicon. Interconnects 33 and 39 may be formed of doped polysilicon, refractory metals, such as, for example, tungsten or titanium or any other materials, such as a composite Ti/TiN/W metallization stack as is known in the art.

The interconnects 33 and 39 are connected by interconnect 35 which is formed over layer 114. Interconnect 35 may also be formed of any doped polysilicon, refractory or non-refractory metals, such as, for example, tungsten or Al or Al—Cu or Cu or any other materials, such as a composite Ti/TiN/W metallization stack as is known in the art. Interconnect 35 may be formed of the same or different material as interconnects 33 and 39 and may be formed at the same or different times as interconnects 33 and 39.

Figure 6:
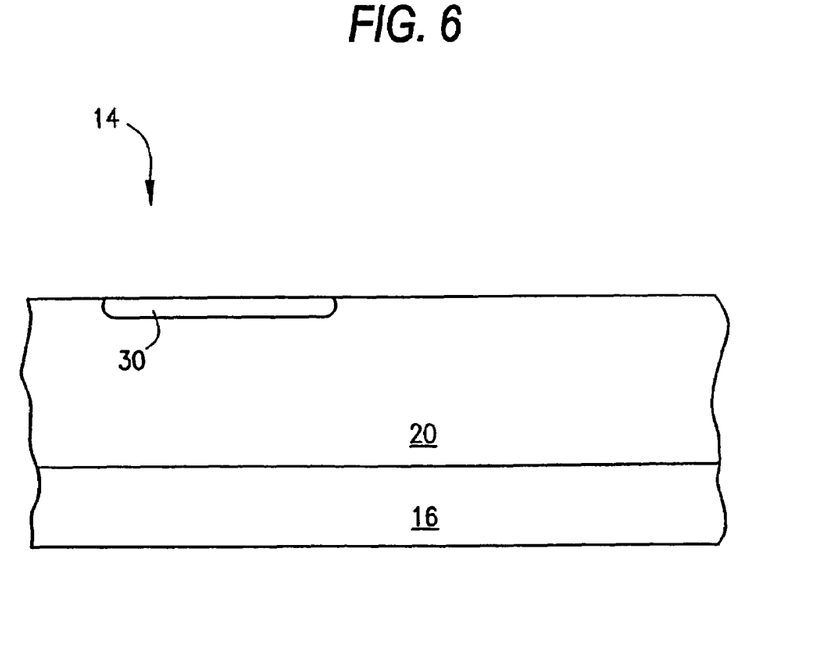
FIG. 6 is a cross-sectional view of a semiconductor wafer undergoing the process of a preferred embodiment of the invention.

The pixel cell 14 is manufactured through a process described as follows, and illustrated by FIGS. 6 through 11. Referring now to FIG. 6, a substrate 16, which may be any of the types of substrate described above, is doped to form a doped substrate layer or well 20 of a first conductivity type, which for exemplary purposes will be described as p-type.

The floating diffusion region 30 may also be formed at this time by any suitable doping process, such as ion implantation. The floating diffusion region 30 is doped to a second conductivity type, which for exemplary purposes will be considered to be n-type.

Figure 7:
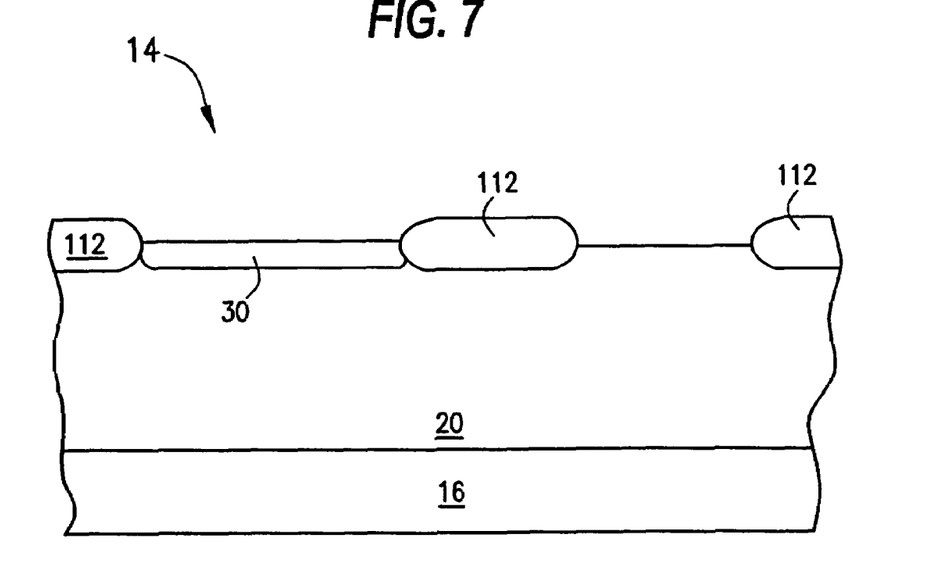
FIG. 7 shows the wafer of FIG. 6 at a processing step subsequent to that shown in FIG. 6.

FIG. 7 illustrates the next step in the process, in which field oxide layers 112 are formed around the cell 14. Field oxide layers 112 are formed to reside in multiple areas of the pixel cell 14 on a side of the photodiode active area 24, between the floating diffusion region 30 and the source follower active area as illustrated in FIG. 7. The field oxide layer 112 may be formed by any known technique such as by thermal oxidation of the underlying silicon in the Local Oxidation of Silicon (LOCOS) process or by etching trenches and filling them with oxide in a shallow trench isolation (STI) process. While the invention has been described as forming the floating diffusion region 30 before the field oxide layers 112, the invention is not so limited and the field oxide layers 112 may be formed before the floating diffusion region 30.

Figure 8:
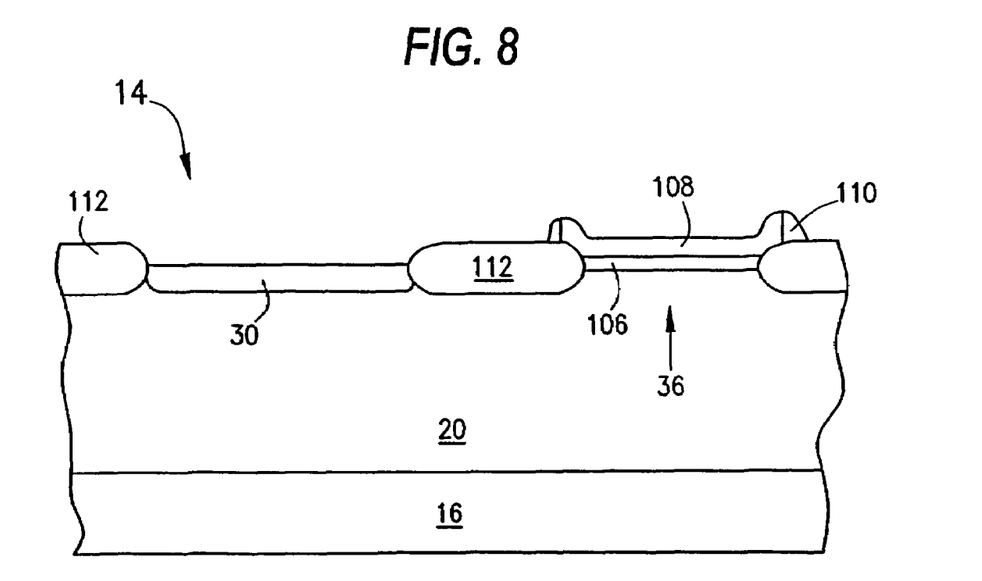
FIG. 8 shows the wafer of FIG. 6 at a processing step subsequent to that shown in FIG. 7.

Next, the source follower gate stack 36 is formed, as shown in FIG. 8. The gate stack 36 includes an insulating layer 106 of silicon dioxide, silicon nitride, or the like on the doped layer 20, which is formed by conventional methods such as thermal oxidation or chemical vapor deposition (CVD). The insulating layer 106 is approximately 10 to 200 Angstroms thick, preferably 30 to 100 Angstroms. The conductive layer 108 may be formed of doped silicon such as polysilicon, of metals such as tungsten, or of a composite stack of polysilicon/silicide or polysilicon/barrier/metal. The barrier metal may be, for example, those such as titanium nitride, tungsten nitride or the like. The conductive layer 108 has a thickness within the range of 200 to 4000 Angstroms.

A silicide layer (not shown) may be used over the conductive layer 108. The silicide layer may be formed by forming a metal layer on the conductive layer 108 by CVD, evaporation or sputtering, followed by an annealing step at a temperature within the range of 500 to 900 degrees Celsius. Insulating sidewalls 110 of silicon dioxide or silicon nitride are be formed on the sides of the gate stack 36 by conventional method.

Figure 9:
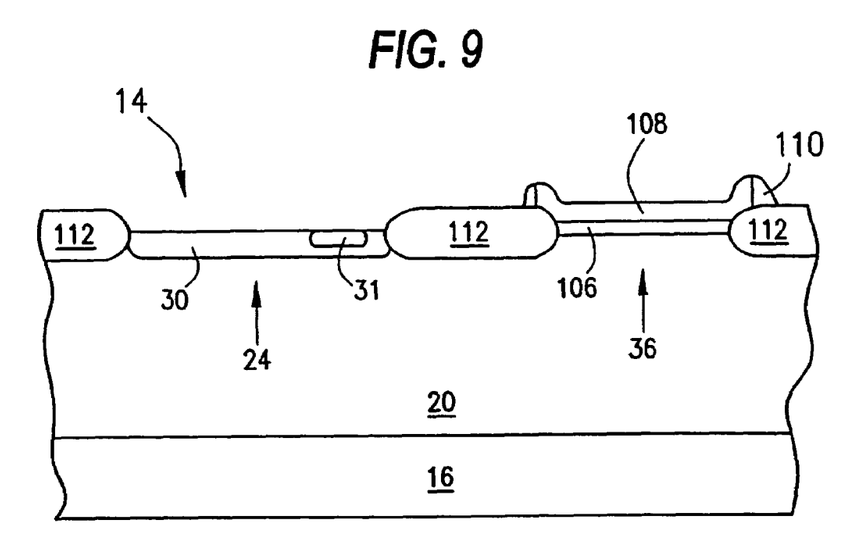
FIG. 9 shows the wafer of FIG. 6 at a processing step subsequent to that shown in FIG. 8.

Referring now to FIG. 9. Highly n+ doped region 31 is formed within doped region 30. N+ doped region 31 is formed in the floating diffusion region and provides good ohmic contact between photodiode 24 and contact 33. The highly n+ doped region 31 may be formed by applying a mask (not shown) to the substrate and doping the region 31 by ion implantation.

Figure 10:
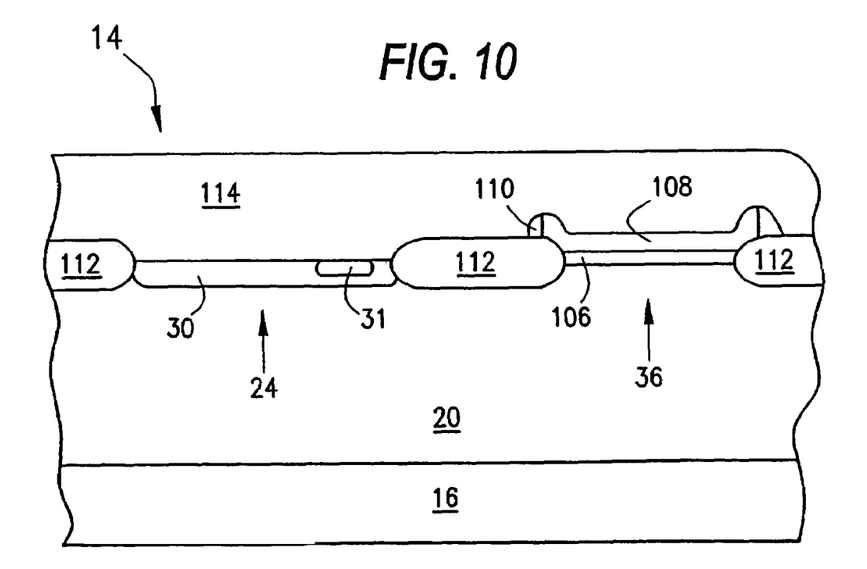
FIG. 10 shows the wafer of FIG. 6 at a processing step subsequent to that shown in FIG. 9.

A layer 114 of borophosphorosilicate glass (BPSG), phosphosilicate glass (PSG), borosilicate glass (BSG), undoped $SiO_2$ or the like is then deposited and planarized by CMP or other conventional methods as shown in FIG. 10.

Figure 11:
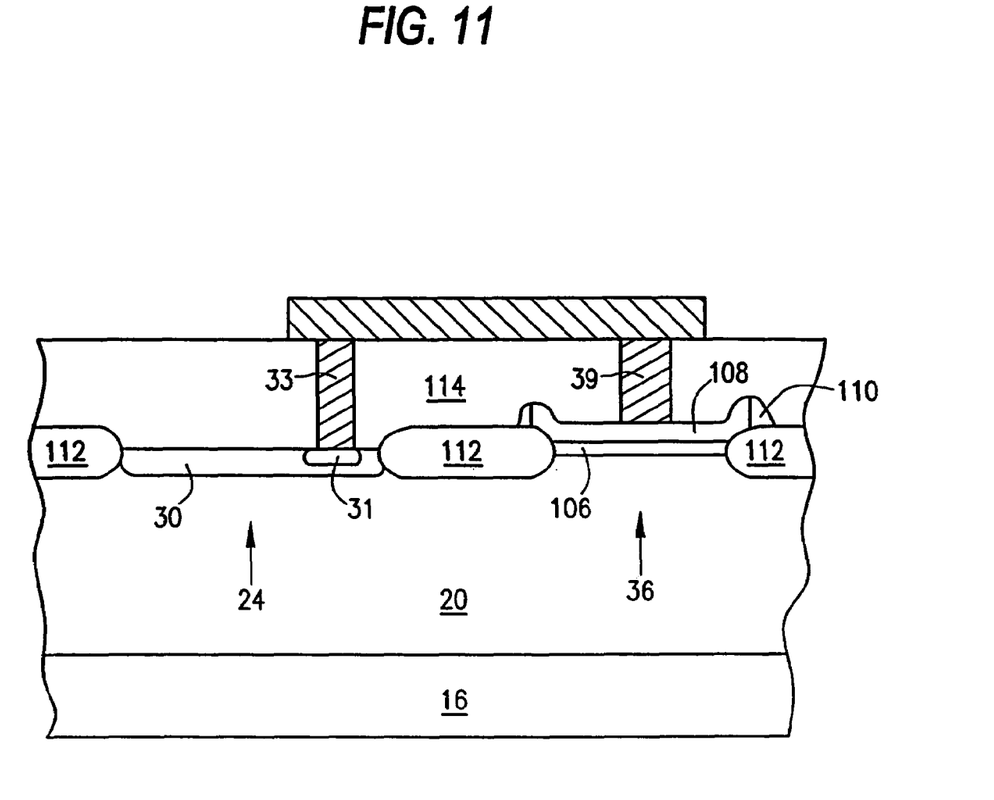
FIG. 11 shows the wafer of FIG. 6 at a processing step subsequent to that shown in FIG. 10.

Reference is now made to FIG. 11. A resist and mask (not shown) are applied and the layer 114 is etched to form interconnects 33 and 39 over the n+ diffusion region 31 and the source follower transistor gate 108 respectively. The layer 114 may be etched by any conventional methods such as a selective wet etch or a selective dry etch. Interconnects 33 and 39 are the same or different and may be formed of any typical interconnect conductive material such as metals or doped polysilicon. Interconnects 33 and 39 may be formed of doped polysilicon, refractory metals, such as, for example, tungsten or titanium or any other materials, such as a composite Ti/TiN/W metallization stack as is known in the art.

The interconnects 33 and 39 are connected by interconnect 35 which is formed over layer 114. Interconnect 35 may also be formed of any doped polysilicon, refractory or non-refractory metals, such as, for example, tungsten or Al or Al—Cu or Cu or any other materials, such as a composite Ti/TiN/W metallization stack as is known in the art. Interconnect 35 may be formed of the same or different material as interconnects 33 and 39 and may be formed at the same or different times as interconnects 33 and 39.

After the processing to produce the imager shown in FIG. 11, the pixel cell 14 of the present invention is then processed according to known methods to produce an operative imaging device. For example, an insulating layer may be applied and planarized and contact holes etched therein as shown in to form conductor paths to transistor gates, etc. Conventional metal and insulation layers are formed over layer 114 and in the through holes to interconnect various parts of the circuitry in a manner similar to that used in the prior art to form gate connections. Additional insulating and passivation layers may also be applied.

The source follower transistor 36 of the first embodiment is essentially complete at this stage, and conventional processing methods may then be used to form other structures in the pixel cell 14 to arrive at a CMOS imager having the features and functions of those discussed with reference to FIGS. 1 through 4. For example, after the circuit structure shown in FIG. 5 is complete and metal interconnect structures formed to the peripheral logic as part of the processing to produce FIG. 5, one or more layers of metalization may be applied over an insulating layer after which passivation layers are applied and etched to form passivation holes which allow for connection of external bond pads with underlying metal layers.

Figure 12:
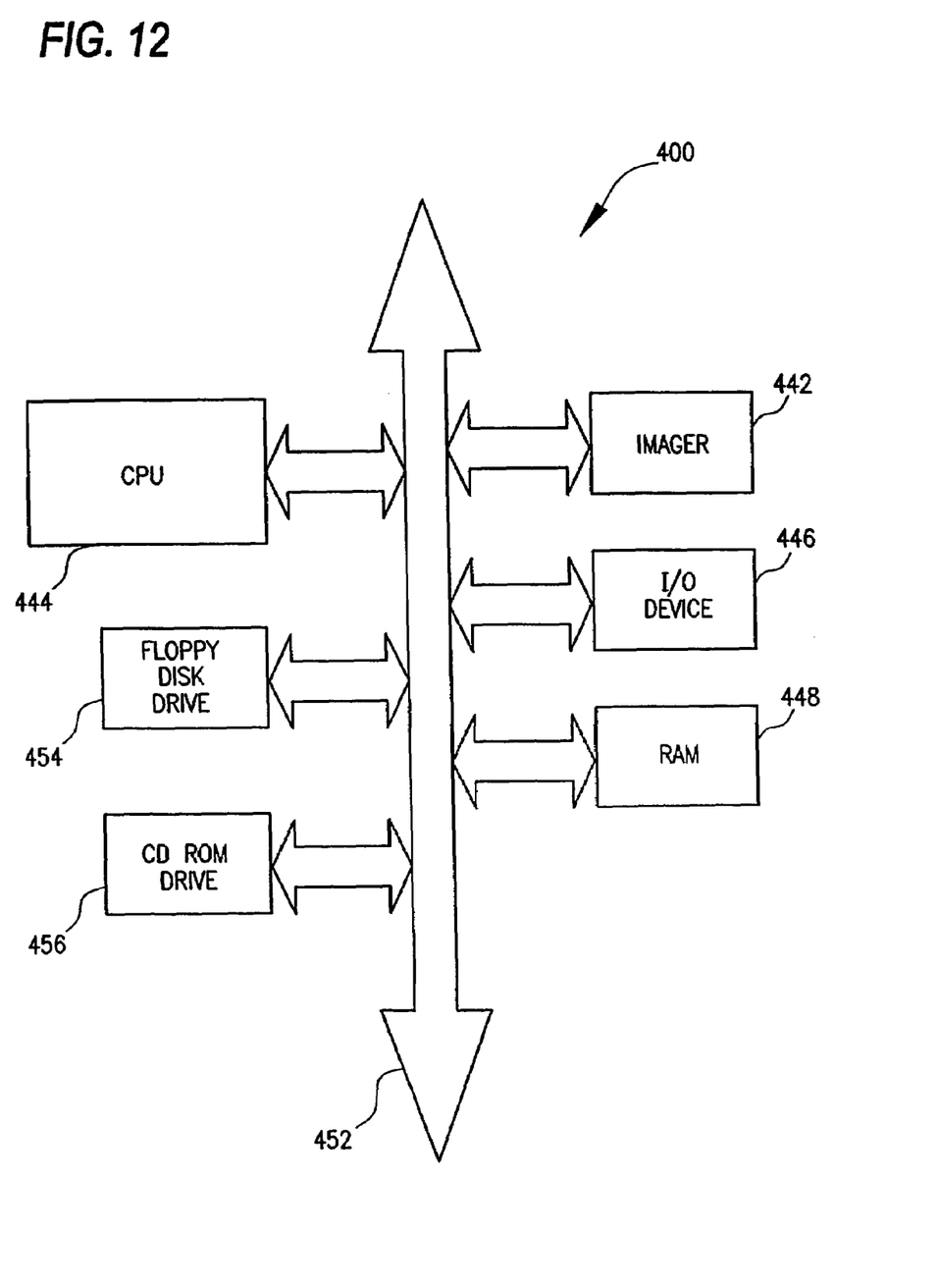
FIG. 12 is an illustration of a computer system having a CMOS imager according to the present invention.

A typical processor based system which includes a CMOS imager device according to the present invention is illustrated generally at 400 in FIG. 12. A processor based system is exemplary of a system having digital circuits which could include CMOS imager devices. Without being limiting, such a system could include a computer system, camera system, scanner, machine vision system, vehicle navigation system, video telephone, surveillance system, auto focus system, star tracker system, motion detection system, image stabilization system and data compression system for high-definition television, all of which can utilize the present invention.

A processor system, such as a computer system, for example generally comprises a central processing unit (CPU) 444, e.g., a microprocessor, that communicates with an input/output (I/O) device 446 over a bus 452. The CMOS imager 442 also communicates with the system over bus 452. The processor system 400 also includes random access memory (RAM) 448, and, in the case of a computer system may include peripheral devices such as a floppy disk drive 454 and a compact disk (CD) ROM drive 456 which also communicate with CPU 444 over the bus 452. CMOS imager 442 is preferably constructed as an integrated circuit which includes pixels containing source follower transistors with very large gates, as previously described with respect to FIGS. 5 through 11. The CMOS imager 442 may be combined with a processor, such as a CPU, digital signal processor or microprocessor, with or without memory storage, in a single integrated circuit.

As can be seen by the embodiments described herein, the present invention encompasses a pixel sensor cell having an enlarged source follower gate that exhibits improved storage capacitance. The large size of the source follower gate increases storage capacitance without requiring an increase in the size of the photocharge collector, thereby permitting use of the pixel cell in dense arrays, and maintaining low leakage levels.

It should again be noted that although the invention has been described with specific reference to CMOS imaging circuits having a photodiode and a floating diffusion region, the invention has broader applicability and may be used in any CMOS imaging apparatus. Similarly, the process described above is but one method of many that could be used. The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A method of operating a pixel device comprising:
   receiving a plurality of photons at a first doped semiconductor region;
   converting at least a portion of the plurality of photons to a plurality of charges in the first doped semiconductor region;
   accumulating the plurality of charges in a second doped semiconductor region;
   transferring the plurality of charges through an electrically conductive path to a gate of a source follower transistor, the gate having an area of from between about 0.3 $\mu m^2$ to about 25 $\mu m^2$; and conducting an electrical current through the transistor, the electrical current having a magnitude related to a quantity of the plurality of photons.

2. A method of operating a pixel device as defined in claim 1 further comprising receiving the plurality of photons at the first semiconductor region through a photo gate.

3. A method of operating a pixel device as defined in claim 1 wherein the electrically conductive path comprises a transfer transistor.

4. A method operating a pixel device as defined in claim 1 wherein the transferring the plurality of charges through an electrically conductive path comprises transferring the plurality of charges through an interconnect.

5. A method of operating a pixel device as defined in claim 4 wherein the interconnect comprises a doped semiconductor material.

6. A method of operating a pixel device as defined in claim 4 wherein the interconnect comprises a metal material.

7. A method of operating a pixel device as defined in claim 6 wherein the metal material comprises a refractory metal material.

8. A method of forming a photosensitive device comprising:
forming photosensitive region disposed at a first portion of a semiconductor substrate, the photosensitive region being adapted to receive a flux of photons and responsively generate a plurality of charges;
forming a transistor gate disposed at a second portion of the semiconductor substrate, the transistor gate being adapted to receive and store a portion of the plurality of charges, the transistor gate having an areal dimension of between about 0.3 $\mu m^2$ and about 25 $\mu m^2$; and
forming an electrically conductive path between the photosensitive region and the transistor gate, the electrically conductive path being adapted to share charges between the photosensitive region and the transistor gate.

9. A method of forming a photosensitive device as defined in claim 8 wherein the conductive path comprises a transfer transistor disposed in a third region of the semiconductor substrate.

10. A method of forming a photosensitive device as defined in claim 8 wherein the conductive path comprises a metal material.

11. A method of forming a photosensitive device as defined in claim 10 wherein the metal material comprises copper.

12. A method of forming a photosensitive device as defined in claim 10 wherein the conductive path comprises a refractory metal material.

13. A method of forming a photosensitive device as defined in claim 12 wherein the refractory metal material comprises tungsten.

* * * * *

UNITED STATES PATENT AND TRADEMARK OFFICE
CERTIFICATE OF CORRECTION

PATENT NO. : 7,199,405 B2
APPLICATION NO. : 10/968289
DATED : April 3, 2007
INVENTOR(S) : Howard E. Rhodes Page 1 of 1

It is certified that error appears in the above-identified patent and that said Letters Patent is hereby corrected as shown below:

Column 9, line 13, "are be formed" should read --are formed--;

Column 9, lines 13-14, "by conventional" should read --by any conventional--; and Column 9, lines 52-53, "as shown in to form" should read --to form--.

In the Claims, the following errors are corrected:

Claim 4, column 11, line 10, "method operating" should read --method of operating--; and Claim 4, column 11, line 11, "transferring the" should read --transferring--.

Signed and Sealed this

Twenty-sixth Day of June, 2007

JON W. DUDAS
*Director of the United States Patent and Trademark Office*